United States Patent
Davis et al.

(10) Patent No.: US 6,756,247 B1
(45) Date of Patent: Jun. 29, 2004

(54) INTEGRATED LARGE AREA MICROSTRUCTURES AND MICROMECHANICAL DEVICES

(76) Inventors: Timothy J. Davis, 2283 State Rte. 96, Trumansburg, NY (US) 14886; Scott G. Adams, 413 Mitchell St., Ithaca, NY (US) 14850

(*) Notice: Subject to any disclaimer, the term of this patent is extended or adjusted under 35 U.S.C. 154(b) by 23 days.

(21) Appl. No.: 10/083,600

(22) Filed: Feb. 27, 2002

Related U.S. Application Data

(62) Division of application No. 09/231,083, filed on Jan. 14, 1999, now abandoned.
(60) Provisional application No. 60/071,569, filed on Jan. 15, 1998.

(51) Int. Cl.[7] .................. H01L 21/00; H01L 21/302
(52) U.S. Cl. .......................... 438/52; 438/739
(58) Field of Search .................. 438/50–53, 739

(56) References Cited

U.S. PATENT DOCUMENTS

| | | | | |
|---|---|---|---|---|
| 4,312,115 A | * | 1/1982 | Diedrich et al. | 29/572 |
| 4,553,436 A | | 11/1985 | Hansson | 73/517 R |
| 4,670,092 A | * | 6/1987 | Motamedi | 156/643 |
| 4,706,374 A | | 11/1987 | Murakami | 437/225 |
| 4,851,080 A | | 7/1989 | Howe et al. | 156/647 |
| 5,000,811 A | * | 3/1991 | Campanelli | 156/264 |
| 5,068,203 A | | 11/1991 | Logsdon et al. | 437/89 |
| 5,121,180 A | | 6/1992 | Beringhause et al. | 357/26 |
| 5,316,979 A | | 5/1994 | MacDonald et al. | 437/203 |
| 5,343,071 A | * | 8/1994 | Kazior et al. | 257/621 |
| 5,393,375 A | | 2/1995 | MacDonald et al. | 156/643 |
| 5,399,415 A | | 3/1995 | Chen et al. | 428/209 |
| 5,610,335 A | | 3/1997 | Shaw et al. | 73/514.36 |
| 5,637,189 A | | 6/1997 | Peeters et al. | |
| 5,645,684 A | | 7/1997 | Keller | |
| 5,726,073 A | | 3/1998 | Zhang et al. | 437/228 |
| 5,846,849 A | | 12/1998 | Shaw et al. | 438/52 |
| 5,980,762 A | * | 11/1999 | Otani et al. | 216/2 |
| 6,271,102 B1 | * | 8/2001 | Brouillette et al. | 438/462 |

FOREIGN PATENT DOCUMENTS

JP 403078232 A * 4/1991

OTHER PUBLICATIONS

Bryzek, J., et al., Micromachines on the march, pp. 20–31, IEEE Spectrum May 1994.

Kuehnel, W., et al., A surface micromachined silicon accelerometer with on–chip detection circuitry, Sensors and Actuators A 45 (1994) 7–16, pp 8–16.

Rockstad, H. K., et al., A miniature high–sensitivity broad–band accelerometer based on electron tunneling ransducers. Sensors and Actuators A, 43 (1994) 107–114, pp 108–114.

Roylance, L. M., et al., A Batch–Fabriated Silicon Accelerometer, IEEE Transactions on Electron Devices, vol. Ed–26, No. 12, Dec. 1979, pp 1911–1917.

Shaw, K. A., et al., SCREAM I: a single mask, single–crystal silicon, reactive ion etching process for microelectromechanical structures, Sensors and Actuators A, 40 (1994) 63–70, pp 63–70.

OTHER PUBLICATIONS

*Primary Examiner*—John F. Niebling
*Assistant Examiner*—Viktor Simkovic
(74) *Attorney, Agent, or Firm*—Jones, Tullar & Cooper

(57) ABSTRACT

Deep reactive ion etching creates a single mask MEMS structure 20–50 ηm deep on the top surface of a wafer. Thereafter, a bottom surface etch cooperates with trenches formed in the MEMS structure to provide through trenches which release large area structures of arbitrary shape and having a thickness up to that of the wafer. The released structure is supported in the wafer by MEMS support beams and motion is detected and affected by MEMS sensors and actuators, respectively.

29 Claims, 7 Drawing Sheets

OTHER PUBLICATIONS

Hirano, T., et al., Design, Fabrication, and Operation of Submicron Gap Comb–Drive Microactuators, J. of Microelectromechanical Systems, vol. 1, No. 1, Mar. 1992, pp 52–59.

Jaecklin, V. P., et al., Comb actuators for xy–microstages, Sensors and Actuators A, 39 (1993) 83–89, pp 83–89.

Arney, S. C., et al., Formation of submicron silicon–on–insulator structures by lateral oxidation of substrate–silicon islands, J. Vac. Sci. Technol. B 6 (1), Jan./Feb. 1988, pp. 341–345.

Diedrick W. Debruin, et al, "Second–order Efects in Self–testable Accelerometers," Solid–State Sensor & Actuator Workshop, p. 149–152, (Apr. 10, 1990).

Lynn Michelle Roylance, "A Batch–Fabricated Silicon Accelerometer," IEEE Transactions on Electron Devices, vol. 26 (No. 12), p. 1911–1917, (Dec. 10, 1979).

* cited by examiner

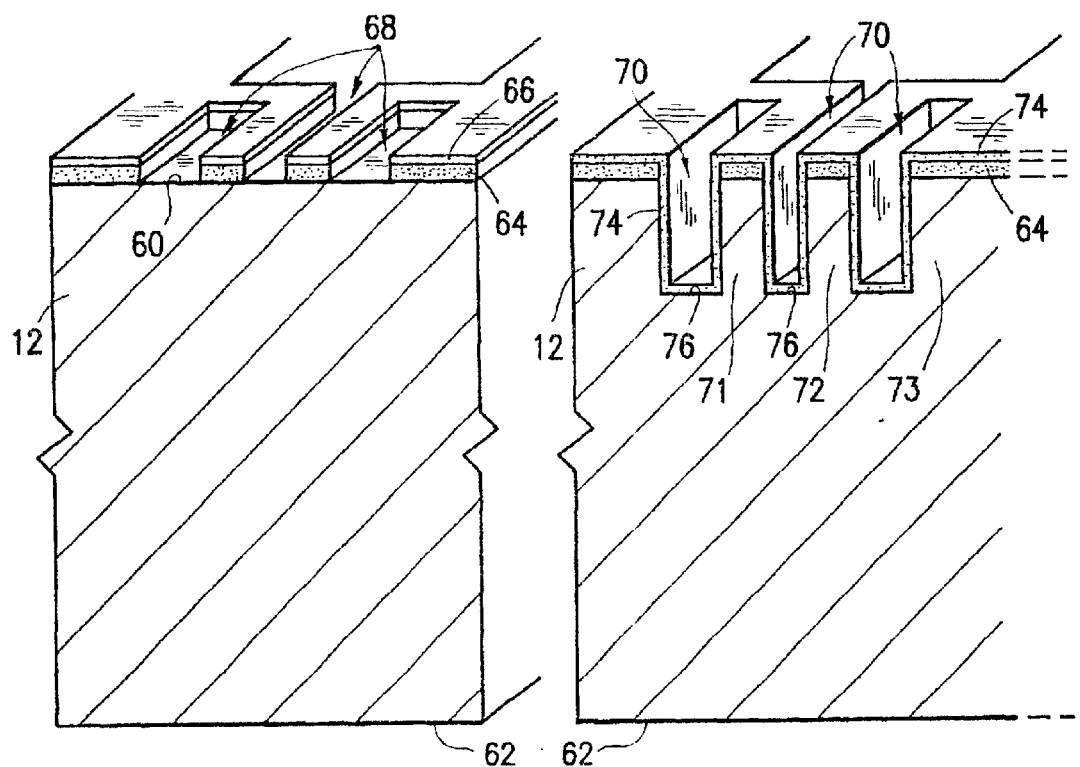
FIG. 3
FIG. 4
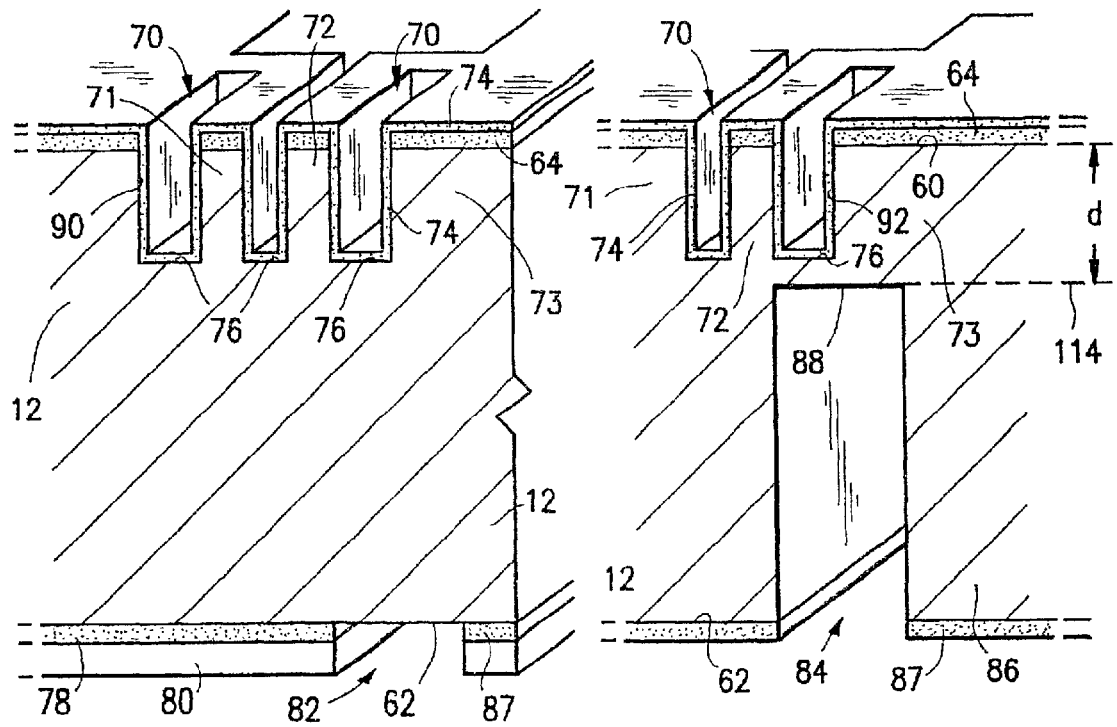
FIG. 5
FIG. 6

INTEGRATED LARGE AREA MICROSTRUCTURES AND MICROMECHANICAL DEVICES

This application is a Division of U.S. application Ser. No. 09/231,083, filed Jan. 14, 1999, now abandoned, which claims the benefit of U.S. Provisional Application No. 60/071,569, filed Jan. 15, 1998, the disclosure of which is hereby incorporated herein by reference.

This application was made with Government support under Grant No. F30602-97-2-0104 awarded by DARPA. The Government has certain rights in the invention.

BACKGROUND

The field of the present invention relates generally to microdevices and microstructures, and more particularly to a microfabrication process which enables the creation of a millimeter-scale, large area movable structure integral with and supported by, micron-scale micromechanical flexures, actuators and/or transducers.

The term microelectromechanical systems ("MEMS") refers to a new technology in which electrical and mechanical devices are fabricated at substantially microscopic dimensions utilizing techniques similar to those well known in the manufacture of integrated circuits. Such devices will be referred to herein as MEMS devices or micromechanical devices for convenience, although it will be understood that present commercial applications of MEMS technology include microelectromechanical transducers such as pressure sensors, inertial measurement devices, electrostatic actuators, and the like, as well as a wide variety of nanometer-scale micromechanical support structures. For an introduction to the use of MEMS technology for sensors and actuators, see for example the article by Bryzek et al. in *IEEE Spectrum*, May 1994, pp. 20–31.

The application of this technology to inertial measurement devices has received a great deal of attention from the microelectromechanical community, as evidenced by the paper by Kuehnel and Sherman "A surface micromachined silicon accelerometer with on-chip detection circuitry," *Sensors and Actuators A* 45 (1994), pp. 7–16, and by U.S. Pat. Nos. 5,245,824, 5,563,343, 5,126,812 and 5,095,752. Microaccelerometers are available as commercial products, and most of these devices have been applied to the sensing required for deployment of airbags in automobiles. This application requires an accelerometer sensitive to accelerations in the range of 50 g (490 m/s$^2$), and microaccelerometers offer size, cost and performance advantages over prior technologies, such as piezoelectric devices, for inertial sensing. There is, however, substantial interest it obtaining micromechanical accelerometers capable of sensing much smaller levels of acceleration, for example in the range of micro-g or even nano-g's ($10^{-5}$ to $10^{-8}$ m/s$^2$), but these low ranges of acceleration have eluded MEMS devices due to the inherent requirement for larger masses to sense smaller accelerations. Although MEMS fabrication techniques are versatile, they are inherently limited as to the surface area, the size and the mass of structures that can be produced.

One attempt to overcome the mass limitations of MEMS structures in accelerometers has been the use of electron tunneling transducers to provide extremely sensitive measurements of the very small displacements resulting from low levels of acceleration. The paper by Rockstad et al., "A miniature high-sensitivity broad-band accelerometer based on electron tunneling transducers," *Sensors and Actuators A* 43 (1994), pp. 107–114, discusses such a device, but the disadvantage of this approach is the complexity of the fabrication process required to obtain such an accelerometer. Furthermore, there are serious issues regarding the long term stability of the tunneling transducer, and accordingly such devices are not well suited to widespread commercial applications such as automotive and consumer products.

The use of wafer bonding techniques to create wafer-thick silicon structures which can serve as large masses, or the addition of layers of heavier materials such as gold as described in the paper by Roylance and Angell, "A Batch-Fabricated Silicon Accelerometer," *IEEE Trans. Electron Devices*ED -26 (1979), pp. 1911–1917 have also been suggested. These approaches have the severe disadvantage of utilizing complex, and expensive, fabrication processes resulting in devices which are not competitive in the commercial marketplace. Therefore, it is desirable to find a cost-effective micromechanical fabrication technology, such as plasma micromachining, to fabricate improved high mass structures which can function as accelerometers in MEMS devices. What is needed is a novel approach to the design and manufacture of micromechanical accelerometers of arbitrary size and shape in which such high mass structures can be obtained to provide for high sensitivity accelerometers without the introduction of complex, low yield manufacturing steps.

The use of MEMS devices as actuators, is described, for example, in the papers by Hirano et al. "Design, Fabrication, and Operation of Submicron Gap Come Drive Microactuators," *J. Microelectromechanical Sys.* 1 (1992), pp. 52–59, and Jaecklin et al. "Comb actuators for xy-microstages," *Sensors and Actuators A* 39 (1993), pp. 83–89. Such actuators are used to effect switching functions, direct fluid flows, move valve assemblies, tilt mirrors, move microstages, and to carry out a wide range of other functions in various microstructures. However, these MEMS actuators have limited dimensions by reason of the process used to fabricate them, and there is a need for a reliable process for making large area structures for use in micromechanical devices. Such large area surfaces would have numerous applications in research as well as in commercial products such as high density data storage, optical deflectors, and the like. Thus, it is desirable to have large area, flat microstages which are capable of being controllably scanned along an axis or in two orthogonal directions (x and y). Moreover, it is necessary that such stages be capable of being scanned over relatively large distances, several tens of micrometers for example. Accordingly, there is a need for an effective process for fabricating large area, optically flat, micromechanical stages coupled with electrostatic actuators capable of large motion actuation in one or two directions.

What is required for both large mass accelerometers and large area microstages is a process for fabricating a large area structure having dimensions up to several millimeters, releasing that structure for motion, and integrating that structure with other micromechanical and microelectromechanical devices which may have dimensions in the range of 1–3 µm. It is further desirable that all of the structures be fabricated from a single crystal silicon substrate material. Moreover, substantially the same fabrication process should be utilized for the creation of the large area structure and other micromechanical and microelectromechanical devices, although it should be understood that there may be circumstances under which it is more effective or economical to utilize a different fabrication process for creation of the large area structure. Further, what is needed is the ability to readily integrate the large area micromechanical devices with microelectronic circuits which may be located on the same wafer, for such circuits are required for signal conditioning, for control of the actuation of the large area structure, and for sensing its motion.

SUMMARY

In order to achieve the foregoing and to overcome the problems inherent in fabricating large area released microstructures, the present invention is directed to a monolithic process for making silicon micromechanical devices in which large area, movable structures are integral with micromechanical flexible supports, or flexures, and microelectromechanical sensors and/or actuators.

A further aspect of the invention is a fabrication technique which permits the integration of a large area released structure with conventional micromechanical devices. The conventional micromechanical devices may be flexible supports, may be motion transducers (capacitive or otherwise) and/or electrostatic actuators, and may be comprised of released beam segments formed with substantially the same processing techniques, such as plasma micromachining, as the large area structure.

Another aspect of the invention is the provision of micron-scale, flexible silicon beam support members, or flexures, capable of supporting a large, millimeter-scale high mass structure and enabling its motion in a desired direction(s) while substantially precluding motion in any other direction. High aspect ratio microbeam structures are utilized in the present invention to support the structure and to provide a requisite mechanical stiffness to prevent out of plane motion, while permitting controlled in-plane motion of the structure.

A still further aspect of the invention is the use of silicon beam flexures such as folded springs to enable large distance electrostatic actuation of large mass structures without introducing mechanical instabilities in the moving structures.

A further aspect of the invention is the use of substantially the same plasma micromachining technique, involving lithography, deposition, and reactive ion etching, at different stages of the device fabrication, from both the front (or top) side of a substrate such as a wafer and from the back (or bottom) side of the wafer to attain the desired structure. Appropriate alignment schemes are used to effect this merger of front and back side processing. The back-side processing could be accomplished with other techniques, such as chemical etching, and, if desired, the fabrication could be carried out through the use of a silicon-on-insulator material rather than a single crystal wafer substrate. Such alternative approaches may be advantageous under certain circumstances.

Another aspect of the invention is the integration of large area millimeter-scale movable structures, micromechanical devices, and conventional microelectronic circuits on a common wafer, or substrate. The preferred plasma micromachining process utilized in the present invention facilitates this integration inasmuch as that process can be carried out on a substrate containing previously fabricated microelectronic devices.

A still further aspect of the invention is the provision of a large, relatively high mass element for use in an inertial sensor, or accelerometer, through the release of a large area solid block having substantially the full thickness of the substrate, the block being supported for relative motion in the substrate and being integral with micromechanical motion transducer elements fabricated from the substrate and located to detect and measure the motion of the block and hence the acceleration being applied to it, or which produce motion in the block, as by the application of electrostatic forces.

Still another aspect of the invention is the creation of a large, flat-surfaced platform within a wafer and mounted for motion in one or two dimensions through the integration of a micromechanical suspension and capable of use as a microstage. The large area microstage and its suspension are formed from an original flat substrate or wafer, the suspended structure being capable of moving in one or two directions in the plane of the structure. Such a microstage can be utilized in a data storage application by providing a mechanism for placing data on the surface, such as by formation of topological features, and a mechanism for sensing such data, such as by scanned probe devices.

In accordance with the present invention, it has been found that a large area, high mass movable structure can be fabricated on a wafer by combining deep reactive ion etch processes based on $SF_6$ gas chemistries, which create single mask MEMS structures 20–50 $\mu$m deep within a wafer or other substrate, with a process for etching through the entire thickness of the wafer. The resulting large area, solid structure can have a depth equal to the thickness of the wafer and can have arbitrary shapes and sizes, for example from 200 $\mu$m up to 6–10 mm on a side. The large area structure is At supported in the wafer by MEMS structures such as cantilevered beams or springs and can be connected to electrical circuitry carried on, or formed in, the wafer by conventional integrated circuit techniques.

The structures of the present invention preferably are fabricated from a silicon wafer or similar substrate which typically is 300–400 $\mu$m thick. A pattern for the MEMS support structure is formed by a standard photolithography process on the top surface of the wafer, and the pattern is then etched into the wafer by a silicon etch, leaving silicon islands, or mesas, having the shape of the desired MEMS support structure and the shape of the large area movable platform, all surrounded by top surface trenches with vertical walls. The top surface etch depth is approximately 20–50 $\mu$m, with the mesas having widths as small as 1–3 $\mu$m. The trench walls are then coated with an oxide.

A second photolithography step forms a pattern for the large area structure on the bottom surface of the wafer, this pattern being accurately aligned with the pattern on the front surface using conventional pattern alignment techniques. The bottom pattern defines the location of a bottom surface trench which will surround the large area structure to release it from the wafer, but which does not include the pattern of the top surface MEMS structure. This bottom surface trench is etched into the bottom of the wafer to a depth which is within about 10–30 $\mu$m of the bottoms of the top surface trenches previously formed, so that the large area structure is not released from the wafer.

Thereafter, the MEMS structure on the top surface of the wafer is completed. This is accomplished by removing the oxide from the floor of the top-surface trench and then etching the exposed silicon to deepen the top surface trenches sufficiently far to intersect the bottom-surface trenches to release the large area structure. This large area structure is retained in the substrate by the mesas formed during the first top surface etching step. Thereafter, the mesas of the MEMS support structure are undercut in a release process to create a cantilever beam support structure array which is connected between selected locations on the substrate and the large area structure. The cantilever beam array suspends the large area structure in a cavity formed within the wafer by the top and bottom trench etches which combine to extend completely through the wafer. A metal layer may be applied, as by sputter coating, to coat the top surfaces and the sidewalls of the support structure to provide electrical surfaces which may serve as capacitors for actuating the device, for sensing its motion, and/or for providing connections to electrical circuitry.

The foregoing is a basic process for fabricating a MEMS—supported large area structure. More complex processes are needed to achieve higher performance. For example, a four masking level process can be used to allow the silicon beams themselves to act as capacitor electrodes. In this case, a patterned metal interconnect may be provided on the beams to provide the desired connections.

The large area portion of the wafer releasable by the above-described process can also be fabricated to have a reduced thickness in order to reduce its mass from the maximum provided by the full wafer thickness. Such a reduction in mass produces a platform-like structure that is more easily moved than the full-thickness block, while retaining the large surface area, and such a structure will be extremely useful in many applications; for example as a microstage. The reduced thickness structure can also be used as a data substrate for high density storage devices, for the large released area can serve as a platform upon which data bits are encoded. In this case a MEMS support structure can be used to scan the platform back and forth beneath a writing or reading head or probe with a positioning accuracy of 25 nm or better.

The large area structure can also be used as a optical deflector, with the MEMS actuators being used to move the reflective deflector surface.

BRIEF DESCRIPTION OF DRAWINGS

The foregoing, and additional objects, features and advantages of the present invention will become apparent to those of skill in the art from the following detailed description of preferred embodiments thereof, taken with the accompanying drawings, in which:

FIGS. 3 through 8 illustrate the process steps of the present invention;

DETAILED DESCRIPTION

Figure 1:
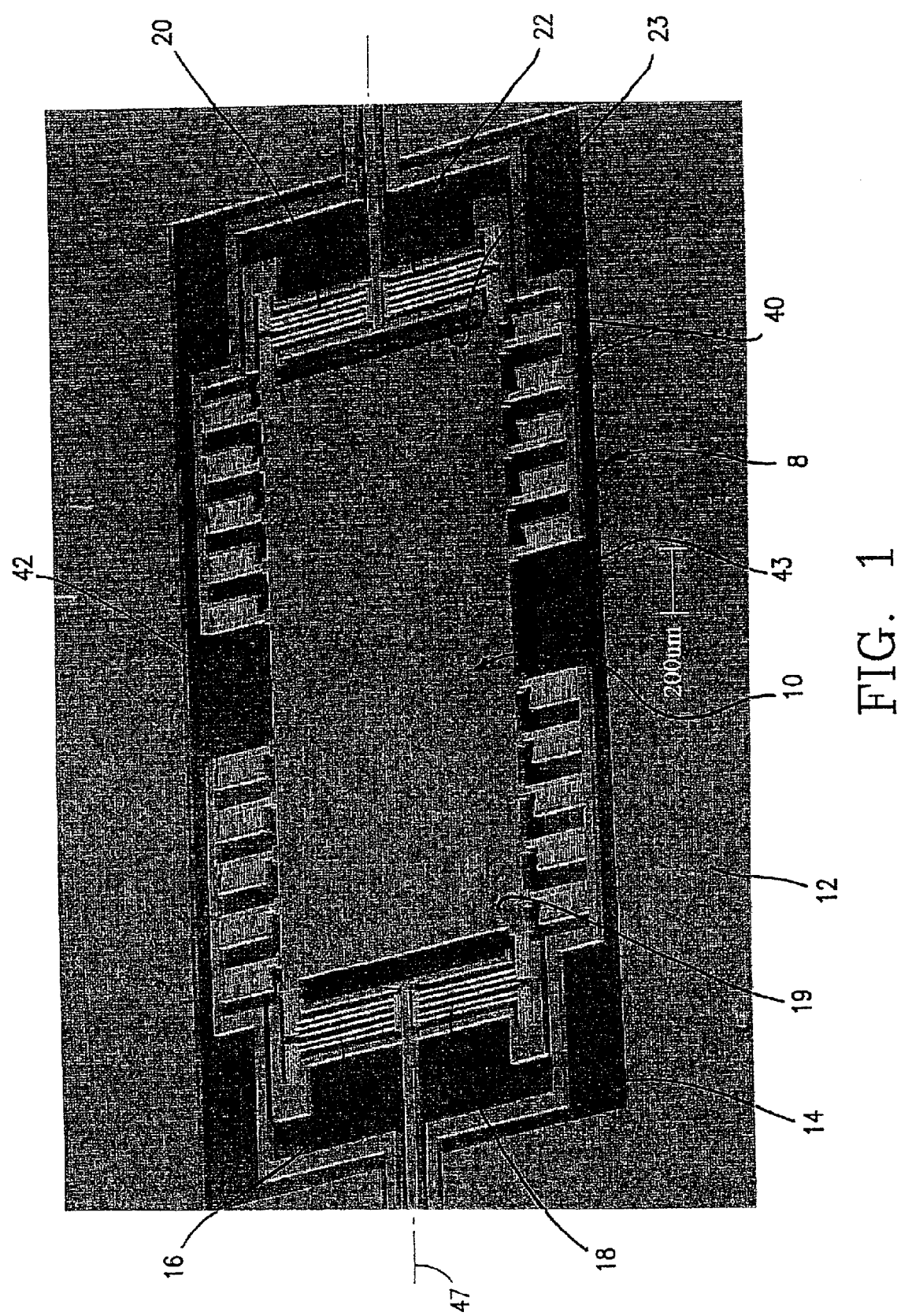
FIG. 1 is a photomicrograph of a MEMS microstructure incorporating a large-area platform supported for motion within a cavity in a substrate and fabricated in accordance with the process of the present invention.
Figure 2:
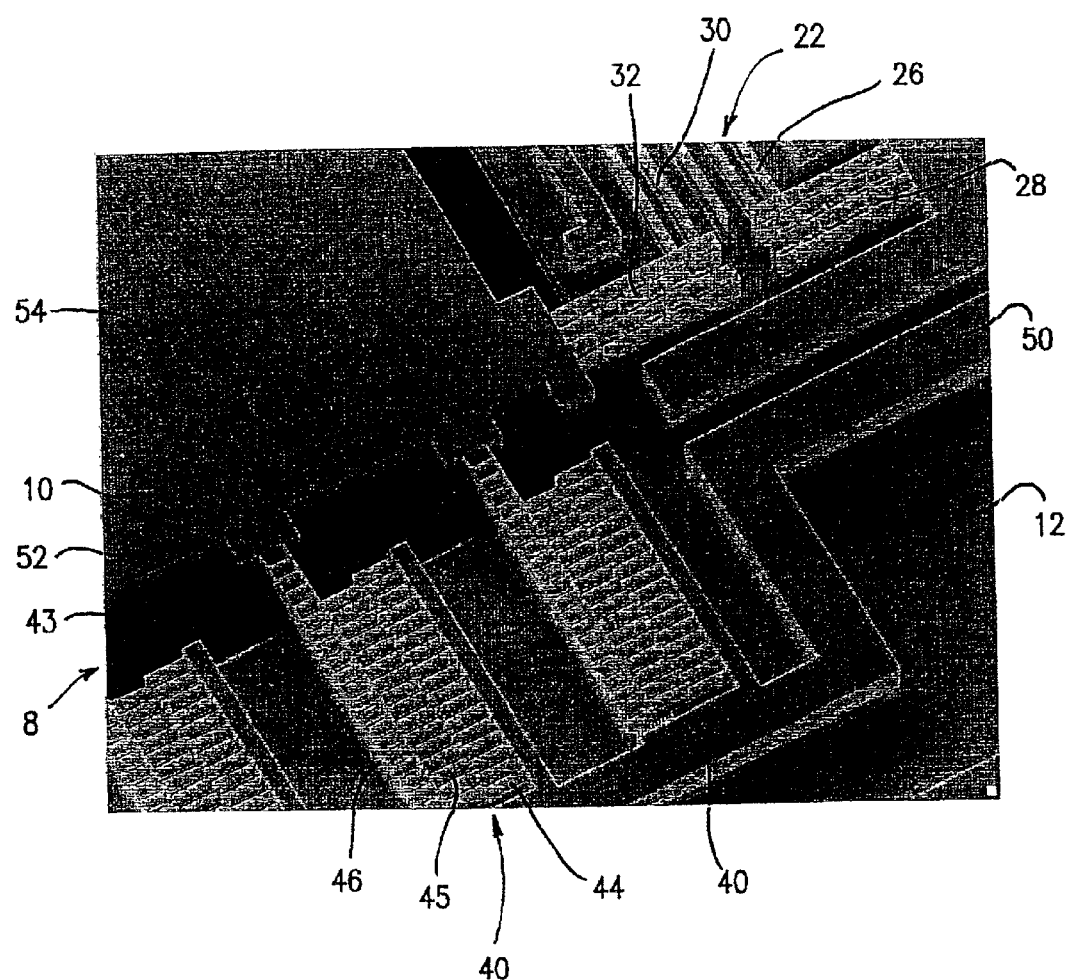
FIG. 2 is an enlarged view of a portion of the microstructure of FIG. 1.

Turning now to a more detailed consideration of the present invention, FIG. 1 is a photomicrograph from a scanning electron microscope of a typical MEMS device 8 fabricated in accordance with the present invention. The device 8 incorporates a large area solid microstructure 10 supported in a substrate 12 such as a conventional silicon wafer. FIG. 2 is an enlargement of a portion of the device of FIG. 1. The microstructure 10 is fabricated from the wafer material, using the etching process of the invention to be described below, and is a solid block of silicon which is cut out of the wafer. As illustrated, block 10 is generally rectangular, although any arbitrary shape can be fabricated with the process of the invention. The block has a thickness and surface area that are significantly greater than are available using the beam structures typically found in EMS devices, and thus may have a mass that is two, three or more orders of magnitude greater than has previously been possible. The block is supported within a cavity 14, which extends from the top surface through the thickness of the substrate, by suitable flexible support structures such as folded springs 16 and 18 at one end 19 of the microstructure block 10 and by similar springs 20 and 22 at its opposite end 23.

As illustrated for spring 22 in FIG. 2, each spring is connected at a first end 26 to a fixed support beam 28 which is integral with substrate 12 and is connected at its opposite end 30 to a support beam 32 mounted on, and integral with the microstructure block 10. Each spring is formed by parallel pairs of legs connected to form a generally u-shaped support structure as illustrated in FIG. 1, with the spring being extensible and contractible to allow motion of the microstructure 10 along its longitudinal x axis. As will be explained in greater detail below, the flexible support structures 16, 18, 20 and 22 are micromachined utilizing the SCREAM-1 process described in U.S. Pat. Nos. 5,198,390 and 5,316,979, the disclosures of which are hereby incorporated herein by reference, although other micromachine technologies can be used. The SCREAM-1 process produces spring structures in the form of silicon beams having high aspect ratios; that is, beams having a width of about 1–3 micrometers and a depth of about 10–30 micrometers, or more. The high aspect ratio of these beams tends to restrict the motion of the microstructure block 12 to its own plane, since the spring structures have little flexibility in the direction perpendicular to the plane of the microstructure.

In the illustrated MEMS device 8, the block 10 has a large surface area, but is not the full thickness of the wafer, having instead a thickness approximately equal to the thickness of the support springs. This produces a block having an intermediate mass, between that of a full-thickness block and that of typical MEMS beams, which is suitable for use as a movable platform such as a ministage, a data storage surface, or the like. In this device, a plurality of actuators 40 are provided along the two opposed side edges 42 and 43 of the microstructure block 10. These actuators are comb-type capacitive actuators which, as illustrated in greater detail in FIG. 2, include a first set of fixed plates 44 mounted on the substrate 12 and a moveable set of parallel plates 45 interdigitated with plates 44 and mounted on a support arm 46 which is integral with the microstructure block 10. The capacitive plates 44 and 45 are parallel with the x-axis 47 of the block 10 and, upon activation by suitable applied voltages, are attracted to move the substrate along the x-axis. The actuators cooperate with the support springs 16, 18, 20 and 22 to provide controlled motion of the block 10. Some or all of the capacitor plates may also act as sensors responsive to motion of the microstructure block 10 in response to applied forces such as acceleration along the x-axis, with changes in capacitance due to any motion of block 10 being detectable by suitable electrical circuitry (not shown) connected to the capacitors by way of metal conductors 50. These conductors are connected to the stationary capacitor plates and to suitable sensor and control circuitry which may be located on the substrate 12.

The microstructure block 10, the supporting springs 16, 18, 20 and 22, and the actuators 40 are preferably fabricated from a substrate such as a single crystal silicon wafer having a polished, flat top surface. The block is formed by an etching process, to be described, which releases it for motion with respect to the substrate but which leaves the top surface 52 of the block level with the top of the substrate and smooth and flat so that it can serve as a data storage area capable of receiving patterned data bits having dimensions of less than 100 nm, as generally indicated at 54 in FIG. 2. The flat surface of the block can also serve as an optical reflector or deflector or provide other like functions. As will be discussed below, the process of the invention not only provides a moveable block having a relatively large, flat top surface area which can be on the order of one or two hundred micrometers to several millimeters on each side, but also permits the thickness of the block to be varied from that of the wafer down to as thin a structure as is compatible with structural integrity and the maintenance of the desired degree of flatness on the top surface, so as to provide a large movable, solid platform for a variety of uses. As noted above, the block 10 is illustrated as being rectangular, but any arbitrary shape may be provided. The block 10 illustrated in FIGS. 1 and 2 provides a data surface on the order of 2 by 3 mm and a thickness of about 50 $\mu$m, which is moveable back and forth along its x-axis to permit scanning of data.

The process of fabricating the structures such as that illustrated in FIGS. 1 and 2 is illustrated in FIGS. 3–8, to which reference is now made. As illustrated FIG. 3, a double-sided, polished silicon substrate 12 having a top surface 60 and a bottom surface 62 is provided. Typically, the substrate will be a wafer that is 300–400 micrometers in thickness, with arbitrary resistivity and crystal orientation. A silicon dioxide layer 64 is grown or deposited on the top surface 60. The oxide 64 is typically thermally grown in an 1100 degree Centigrade furnace to a thickness of 750 nm, although it also can be deposited using chemical vapor deposition (LPCVD or PECVD) techniques. Thereafter, a standard photolithography step is used to define both the block 10 and a desired pattern of silicon beams such as the flexible support structures 16, 18, 20 and 22 and comb actuators 40 for supporting and actuating the block 10. This pattern is formed in a photoresist layer 66 as illustrated at 68. The pattern 68 is transferred to the oxide layer 64 using reactive ion etching. A common oxide etching procedure uses $CHF_3$ or $CF_4$ in a high density etch chamber such as an inductively coupled plasma (ICP) or a magnetically enhanced reactive ion etcher (MERGE), to achieve etch rates in excess of 200 nm per minute.

After the oxide etch has been completed, a structure silicon etch is performed using high etch rate, high selectivity reactive ion etching. The silicon etch, illustrated in FIG. 4, produces silicon trenches 70 extending through the top surface 60 into wafer 12 In top plan view, the trenches surround unetched silicon islands, or mesas, such as the mesas 71, 72 and 73, and define the side walls of a cavity surrounding the MEMS device 8. The silicon etch may use a process such as that developed by Robert Bosch GmbH (see U.S. Pat. No. 5,501,893) which cycles between etching and passivation to obtain silicon etch rates exceeding 2 micrometers per minute with a selectivity to photoresist exceeding 50 to 1 and a selectivity to oxide exceeding 100 to 1. In the etch cycles, $SF_6$ is typically flowed with Argon in a high density etcher chamber, such as an inductively coupled plasma chamber, and etches silicon at high rates. During passivation cycles, a carbon-fluorine gas is flowed instead of $SF_6$ to promote deposition on all surfaces. Cycling between etch and passivation protects the trench sidewalls, and allows for a high etch rate of silicon while providing vertical profiles for the trenches with high selectivity. The etch depth for this step is approximately 20–50 micrometers, with mesa widths typically being as small as 1–3 micrometers and as large as desired for the large area block to be formed, for example from mesa 73.

After the silicon etch of the wafer 12, the mesa sidewalls and the sidewalls of the surrounding substrate are protected by depositing or growing a thin silicon dioxide layer 74. This layer is designed to protect the mesas sidewalls during excessive etch steps such as are required for releasing the structure, and also covers the floor 76 of is the trenches and the top surface of the layer 64. This sidewall layer is typically deposited, and is usually less than 300 nm thick. If desired, a thick (greater than 10 micrometers) layer of a photoresist material may be spun onto the top surface of the wafer and into the trenches 70 to protect them during the processing of the bottom surface 62 of the wafer 12, to be described.

As illustrated in FIG. 5, the next step in the fabrication process is a further definition of the large area block or platform 10 which is to be formed from the substrate and suspended in a cavity in the substrate by the flexible support structures previously defined on the top surface. The bottom surface 62 is covered by an oxide layer 78 which may be in place as a result of the initial thermal oxidation of the wafer during processing of the front (top) surface. If no oxide layer is present, a layer may be deposited through chemical vapor deposition techniques, and a photolithography process is performed using a thick (greater than 5 micrometers) photoresist layer 80 on the oxide layer 78. The photoresist is exposed using a double-side mask aligner so that the exposure on the bottom surface of the wafer is accurately aligned with the existing patterns on the top surface of the wafer. The photolithography step defines a pattern 82 that will be etched into the bottom surface of the wafer to define the perimeter of the suspended silicon block 10. This pattern is aligned with the top surface pattern so as to cooperate with the top surface trench to produce a through trench which extends through the wafer and surrounds a desired through-wafer structure. When maximum mass is desired, as in an accelerometer application, the resulting block of silicon has the same thickness as the wafer. When a lesser mass is desired for the block, the bottom surface trench can be widened to define an area of the bottom surface over which the wafer will be thinned, as may be desired when the large area block is to be used as a scanning platform, as for data storage or recovery. The photolithography pattern created in the photoresist layer is transferred to the bottom surface oxide layer 78 using a standard oxide etching process.

As illustrated in FIG. 6, a bottom surface etch is then performed through the pattern 82, as by using the Bosch silicon etch technique described above, to carve out a bottom surface trench 84 which extends around the periphery of the region 86 of the wafer which is to become the large area block or platform. As illustrated, the bottom surface of the region 86 is protected from the etch by the portion 87 of the patterned oxide layer 78 when the full thickness of the region 86 is to be maintained. The etching of trench 84 is stopped short of the floor 76 of the trenches 70 formed in the top-surface etching so as to prevent the region 86 from being freed from the substrate during this step. Normally, this is done by timing the bottom surface etch to insure that the floor 88 of trench 84 stops 10–30 micrometers away from the floor 76. If the substrate 12 is 400 micrometers thick, and if the trenches 70 are etched to a depth of 30 micrometers, the target etch depth for the trench 84 would be approximately 350 micrometers.

Figures 7, 8:
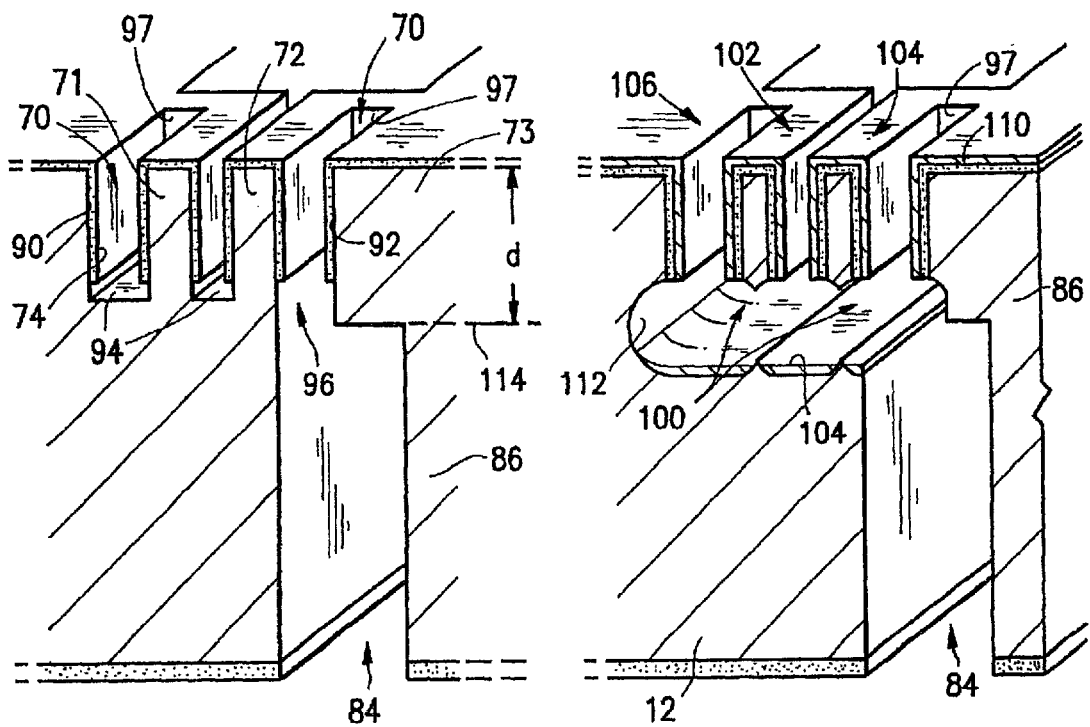

The device is completed, as illustrated in FIG. 7, by finishing the top surface processing. First, if a protective layer of photoresist has been spun on to the etched features on the top surface, that photoresist layer is removed using a wet (chemical) or dry (plasma) etched process. Thereafter, a blanket oxide etch is performed in order to remove the passivation oxide layer 74 from the horizontal surfaces of the substrate, thus exposing the silicon at the floor 76 of the trenches 70 and a trench etch is performed in order to extend the depth of the trenches 70. This serves to expose more silicon at the bottom of the trenches and beneath the side wall oxide layer 74, as illustrated at 94, in order to facilitate the later release of the mesas, but also serves to join the portions of top trench 70 which surround the periphery of region 86 and which are aligned with the bottom trench 84 with the bottom trench to produce a through trench, indicated at 96, which extends completely through the wafer. The through trench 96 forms a cavity in the wafer to thereby release the large area region 86, except where it is joined to the substrate by the mesas which will form the flexible support structures or actuators, as at bridges 97.

Figure 9:
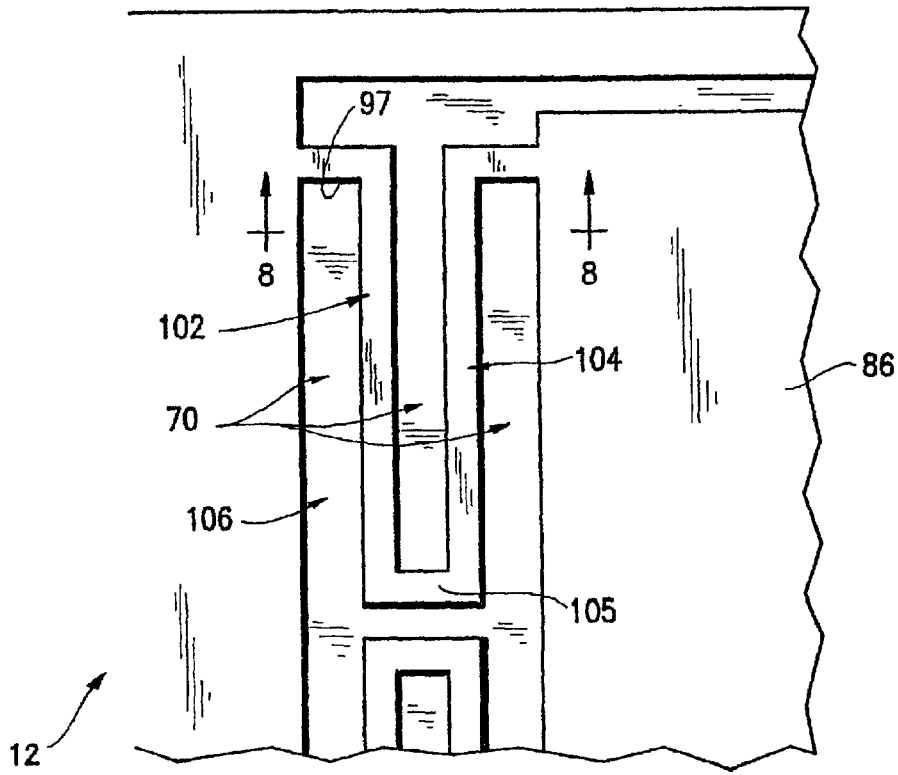
FIG. 9 is a top plan view of the structure illustrated in the process steps of FIGS. 3–8, the illustrated steps being taken at cross-sectional line 8—8 of FIG. 9.

Thereafter, as illustrated in FIG. 8, an isotropic silicon release etching step is performed, based on $SF_6$ in an ICP plasma, in trenches 70. This completes the structure by undercutting the mesas 71 and 72, as illustrated at 100, to create cantilever beams 102 and 104 which are joined together at one end, as illustrated at 105 in FIG. 9, and which are secured at bridges 97 to the substrate 12 and to the now released large area region 86 which forms the block 10 discussed above. This undercutting step may also serve to remove any remaining thin layer of silicon surrounding the large area region 86. The final released device is thus comprised of a large area silicon mass 86 which may be the thickness of the original wafer 12 and which is attached to and is integral with the wafer and is suspended in a cavity in the wafer by a cantilever beam array 106 formed from the released mesas 71 and 72.

A metal layer 110 may be sputtered onto the exposed surfaces of the substrate, the large area mass 86 and the flexible support arm array 110, as illustrated in FIG. 8, to provide conductive surfaces for use in activating the device or for providing sensors to detect motion. The metal coats the tops and sidewalls of the structure as well as a portion of the exposed floor of the substrate, as illustrated. The undercut portion indicated at 112 breaks the electrical path between the coating on the floor of the substrate and the coating on the top surface and sidewalls.

If a thinner large area mass 86 is desired, the masking step at the bottom surface of the substrate illustrated in FIG. 5 would be modified; for example, by removing the mask from the region 87, which in the process of FIG. 5 defines the location of the block to be supported in the cavity. By removing this region of the mask, the etching step of FIG. 6 would enlarge the trench 84 to extend completely across the area of the region 86 (or across any desired portion of it, as defined by the mask), and as a result, the surface 88 illustrated in FIG. 6 would form the bottom surface of the block as illustrated by the dotted line 114, and the thickness of the block would be equal to the distance between surface 88 and the top surface 60 of the original substrate as indicated by the distance d in FIGS. 6 and 7. This thinner block would be suitable as a movable platform for applications where a wide range of motion is desired, as indicated above.

Although the process has been described as including the application of a metal layer 110, it will be understood that if desired a more complicated process can be used where, instead of providing a final layer of metal, a patterned metal interconnect on top of an oxide layer on the silicon beams can be provided. This would allow the beams themselves to be used as capacitor electrodes by electrically isolating them from the substrate by oxide isolation segments transverse to the beams.

The process of FIGS. 3–8 results in a high mass solid silicon block cut out of a silicon wafer and suspended in a cavity extending through the full thickness of the wafer. The mass inherent in such a structure is 100–1000 times that of a silicon 20 device fabricated by the SCREAM-1 process described above and used to fabricate high aspect ratio, thin beams such as the flexible connector array 106 illustrated in FIG. 8. Since the large area device can have dimensions in the millimeter scale rather than the micrometer scale, it can have a high mass which may be used, in one preferred form as a highly sensitive inertial sensor. Since the resolution of such a sensor is proportional to the proof mass of the device, this structure can provide an accelerometer having sub-milli-g resolutions.

Figure 10:
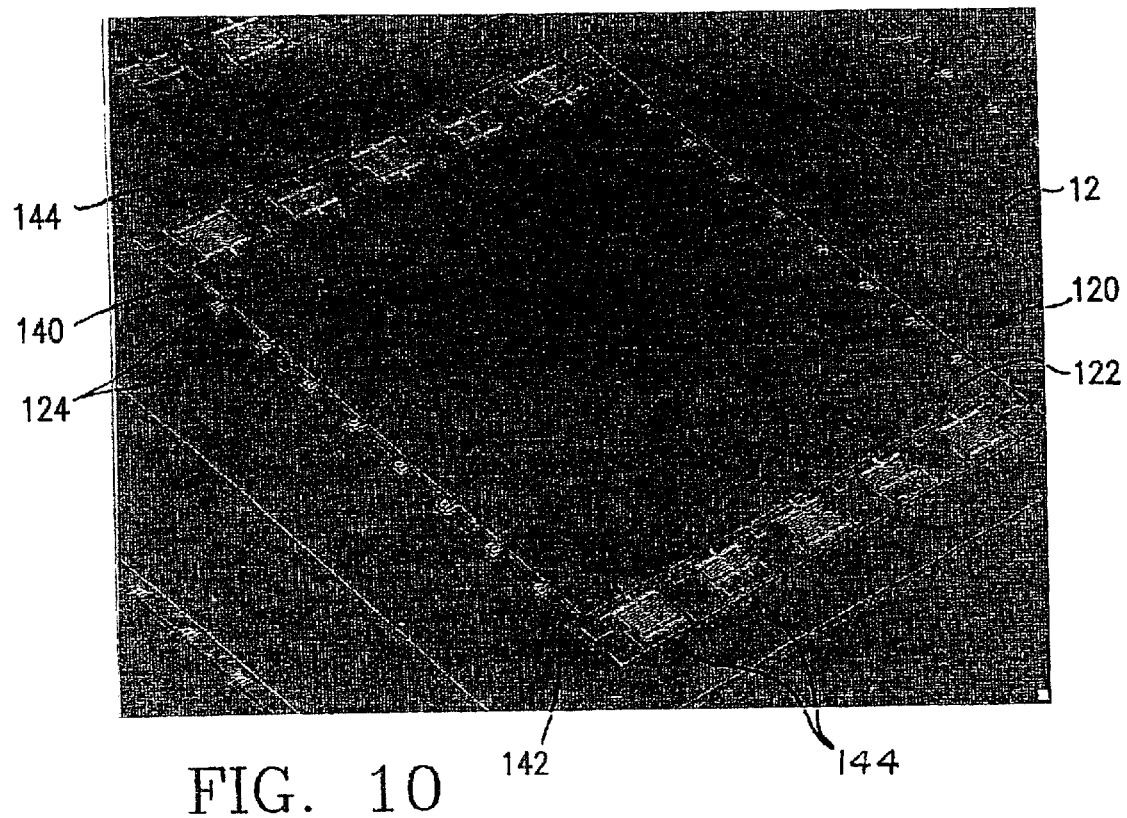
FIG. 10 is a photomicrograph of a second MEMS microstructure fabricated by the process of the present invention.
Figure 11:
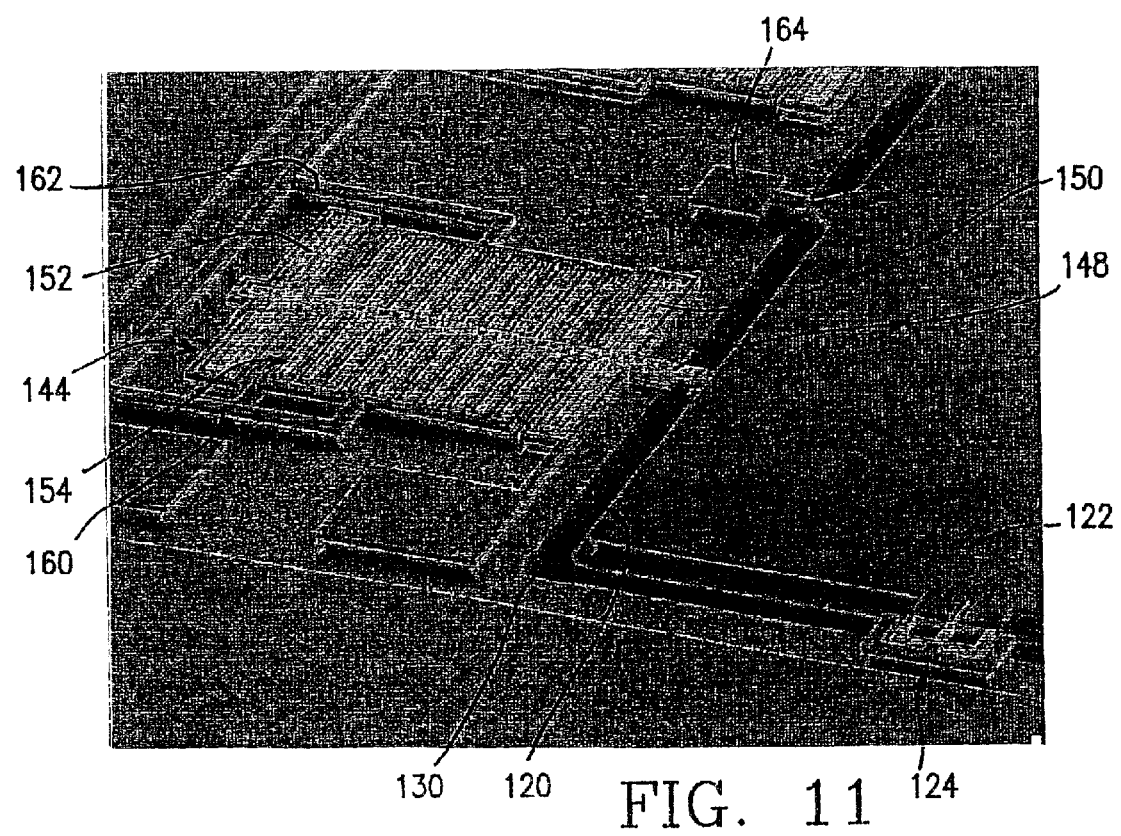
FIG. 11 is an enlarged view of a portion of the microstructure of FIG. 10.
Figure 12:
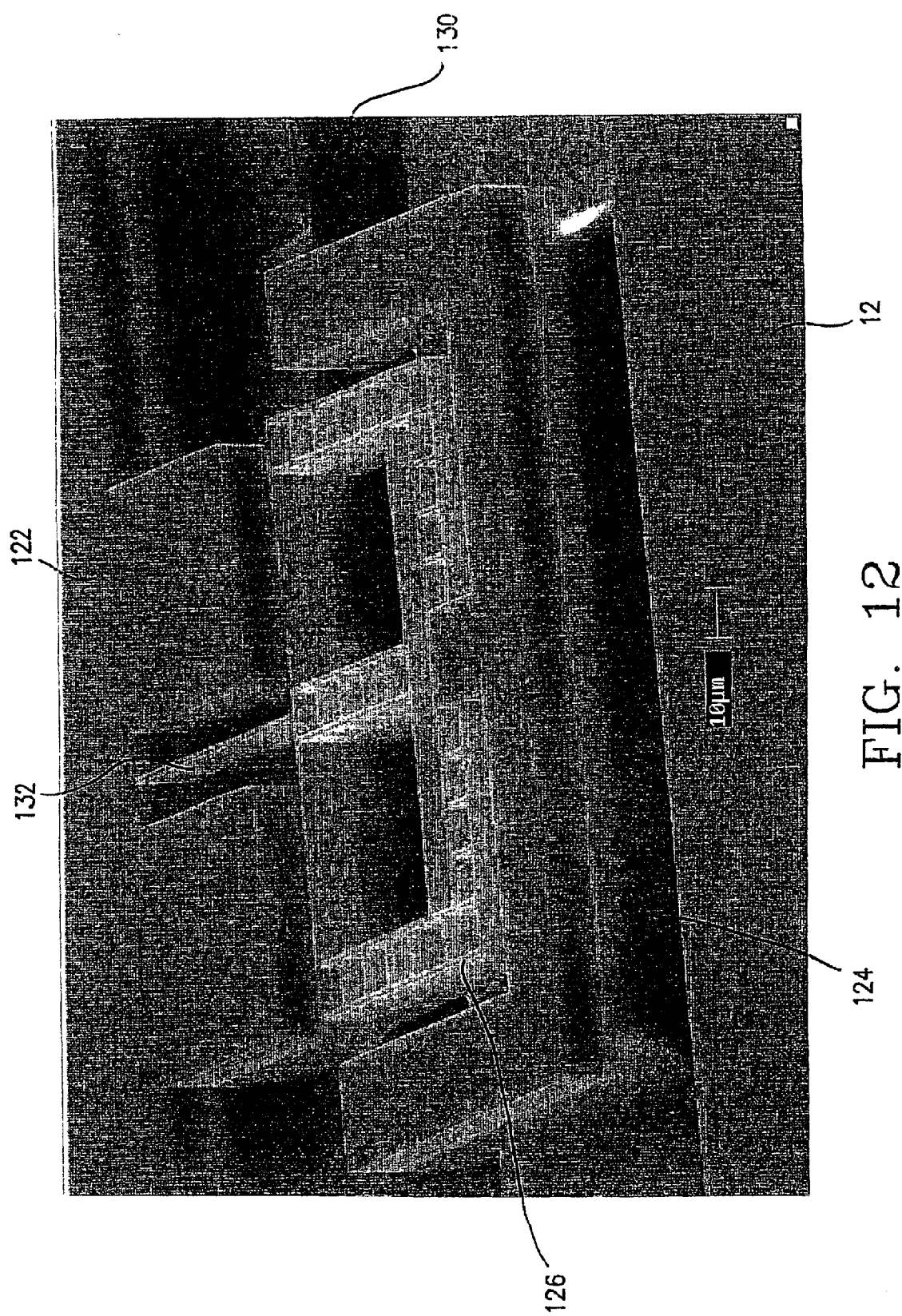
FIG. 12 is an enlarged view of a portion of FIG. 11.

FIG. 10 is a top perspective view of a high mass accelerometer 120 mounted in the substrate, or wafer 12 as discussed above. The accelerometer includes a high mass large area block 122 fabricated in accordance with the description of FIGS. 3–8, the block 122 having the full thickness of the wafer and in the illustrated embodiment having top surface dimensions of approximately 5 millimeters by 6 millimeters. The block 122 contains approximately 28 milligrams silicon, a factor of 1000 increase in the typical accelerometer mass formed utilizing the SCREAM-1 process on the top surface only of the substrate. In the illustrated embodiment, the block 122 is supported along its longest sides by a plurality of spaced flexible support structures 124, illustrated in greater detail in FIGS. 11 and 12. These flexible supports, or springs 124 are connected between the large area block 122 and the substrate 12 by a fixed beam support structure 126 formed on substrate 12 and extending partially over the trench 130 which corresponds to the through trench 96 described above. A thin flexible arm 132 extends from the fixed support 126 to the block 122 and supports the released block. The specific shape of the support springs is a matter of design. At the opposite ends 140 and 142, the block 122 is supported by a plurality of spaced variable capacitor beam and spring flexure assemblies 144. As illustrated in the enlarged view of FIG. 11, the assemblies 144 consist of a central backbone 148 connected at one end to the released block 124 and connected at the other end to elongated springs 150 and 152 and variable capacitors 154. The variable capacitors include moveable arms integral with the beam 148 and stationary arms integral with the substrate 12. The springs 124, 150 and 152 tend to hold the block 122 in a stable position within the substrate, with the block being surrounded by trench 130 which extends through the substrate in the manner illustrated with respect to trench 96 in FIG. 8. The capacitors are connected to external circuitry by way of surface connectors 160 and 162 to sense even slight relative motion of the moveable and stationary capacitive plates in response to longitudinal forces applied to block 122 in a direction parallel to the beam 148. Only very slight motion of the microstructure is required to provide a detectable output, so that the device illustrated in FIGS. 10–12 acts as a highly sensitive accelerometer. A stop 164 may be provided adjacent to the block to limit its motion, if desired.

Figure 13:
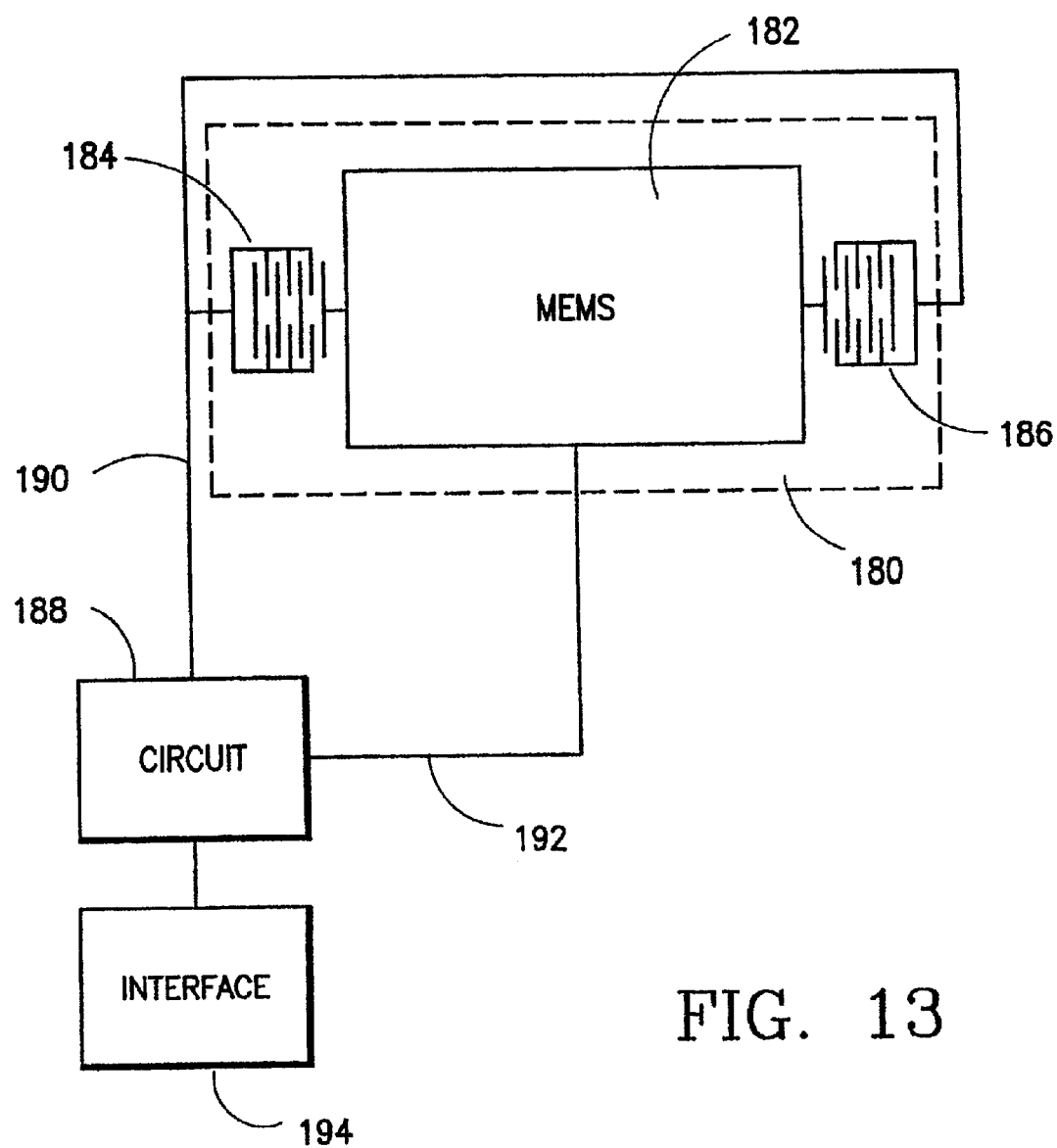
FIG. 13 is a block diagram of a system in which a large area microstructure device is connected to an electronic circuit.

The connection of a microstructure device to an external electronic circuit is illustrated in FIG. 13. A microstructure 180 includes a large area portion 182 which is connected to microelectromechanical capacitors 182 and 184, as discussed above. The capacitors are electrically connected to an electronic circuit 188, which can be in the form of a discrete or an integrated circuit, through connectors 190 and 192. The connectors may be wires, printed circuit leads, package leadframes, wire bonds, or other electrical components, or any combination thereof. In sensing applications, the circuit 188 is typically composed of charge amplifiers and other components to sense variations in the capacitance of capacitors 184 and 186 resulting from motion of the large area mass 182. In actuating applications, where the mass 182 is to be moved, the circuit 188 is preferably composed of drive amplifiers and other components which apply selected actuating voltages to the capacitors to produce forces between the capacitor plates which result in controlled motion of the mass. In either instance control over the circuit functions is achieved through the design of the structure and by the electrical inputs. These inputs may be provided through an arbitrary electronic interface 194, which may be, for example, another circuit or a programmable computer.

Although the present invention has been described in terms of preferred embodiments, it will be understood that variations and modifications may be made without departing from the true spirit and scope thereof, as set forth in the following claims.

What is claimed is:

1. A process for fabricating a solid, large area platform mounted in a cavity in a wafer and supported for motion with respect to the wafer by integral, flexible, supports, comprising:

producing on a top surface of the wafer a first pattern defining the size, shape and location of the large area platform and the supports for the platform;

etching through said first pattern to produce in a top portion of the wafer top surface trenches surrounding mesas corresponding to said platform and said supports;

producing on a bottom surface of the wafer a second pattern corresponding to the size, shape and location of said platform;

etching through said second pattern to produce in a bottom portion of the wafer a bottom trench corresponding to said platform, the bottom trench being aligned with but spaced below the top trench surrounding the mesa corresponding to said platform;

further etching the top trenches to cause the top surface trench surrounding the mesa corresponding to said platform to intersect said bottom trench to produce a though trench to free said platform; and additionally etching said top trenches to undercut said mesas to release said supports from the wafer underlying the supports, the ends of said supports being integral with and cantilevered from the wafer and the platform and extending therebetween to support the platform.

2. The process of claim 1, wherein producing said first pattern on the top surface of a wafer includes coating the top surface with an oxide layer, and photolithographically patterning said oxide layer.

3. The process of claim 2, wherein etching through said first pattern includes performing a silicon etch using a high etch rate high selectivity reactive ion etch.

4. The process of claim 3, wherein said etching includes alternate etch and passivation cycles.

5. The process of claim 1, wherein producing a second pattern on a bottom surface of said wafer includes coating the bottom surface with a second oxide layer and photolithographically patterning said second oxide layer.

6. The process of claim 5, wherein patterning said second oxide layer includes aligning a bottom surface pattern with the pattern produced on said top surface.

7. The process of claim 5, wherein etching through said second pattern includes performing a second silicon etch which extends into said safer and stopping said second silicon etch before it reaches said top surface trenches.

8. The process of claim 1, wherein further etching includes deepening said top surface trenches to intersect said bottom trench.

9. The process of claim 1, wherein additionally etching said top trenches includes an isotropic silicon release etch.

10. The process of claim 1, further including sputter coating said large area platform, and said flexible supports and said actuators with a conductive material.

11. A process for fabricating a micromechanical device comprising:

producing a first pattern on the top surface of a substrate;

etching said pattern to form a first trench in the substrate with a depth of less than twenty (20) percent of the substrate thickness;

producing a second pattern on the bottom surface of the substrate;

etching said second pattern to form a second trench in the substrate with a depth which is less than the thickness of the substrate minus the depth of the trench formed from the top surface;

further etching said top surface trench to cause the bottom of said first trench to intersect with said second trench.

12. The process of claim 11, wherein said etching is accomplished by reactive ion etching techniques.

13. The process of claim 11, wherein said substrate is a silicon wafer.

14. The process of claim 11, wherein the step of etching said pattern to form said first trench includes etching to a depth of between 20 and 50 microns.

15. A process for fabricating a micromechanical device comprising:

producing a first pattern on the top surface of a substrate;

etching said pattern to form a plurality of top trenches in the substrate with a depth of less than twenty (20) percent of the substrate thickness;

producing a second pattern on the bottom surface of the substrate, said second pattern being aligned with the top surface pattern so that at least one structure defined by said second pattern lies directly opposite at least one trench formed from the top surface;

etching said second pattern to form a bottom trench in the substrate with a depth which is less than the thickness of the substrate minus the depth of the trench formed from the top surface;

further etching said top surface trenches to cause lateral etching in at least one pair of adjacent trenches to undercut and thereby release the structure between them, and to cause vertical etching of the bottom of at least one top trench to cause it to intersect with the bottom trench previously formed by etching from the bottom surface.

16. A process for fabricating a solid, large area platform mounted in a cavity in a wafer by integral, flexible supports, comprising:

producing on a top surface of the water a first pattern defining the size, shape and location of a large area platform, supports for the platform, and electrodes for the platform;

etching through said first pattern to produce in a top portion of the wafer top surface trenches surrounding mesas corresponding to said platform, said supports and said electrodes;

depositing a protective layer on said mesas, the walls of said trenches and the bottom surfaces of said trenches;

producing on a bottom surface of the wafer a second pattern corresponding to the size, shape and location of said platform and vertically aligned with said first pattern;

etching through said second pattern to produce in a bottom portion of the wafer a bottom trench corresponding to said platform, the bottom trench being aligned with but spaced below the top trench surrounding the mesa corresponding to said platform;

removing the protective layer from the bottom surfaces of the top trenches; and further etching the top trenches vertically to cause the top surface trench surrounding the mesa corresponding to said platform to intersect said bottom trench to produce a through trench to free said platform, and to horizontally undercut said mesas to release said supports and said electrodes from the wafer underlying the supports and electrodes, the ends of said supports being integral with and cantilevered from the wafer and the platform and extending therebetween to support the platform.

17. The process of claim 16, wherein producing said first and second pattern includes coating the wafer with an oxide layer and producing said pattern in said oxide layer by photolithography and etching.

18. The process of claim 16, wherein said etching of trenches includes performing silicon etching by reactive ion etching techniques.

19. The process of claim 16, further including depositing electrically conductive material on the top surfaces of said platform, said supports and said electrodes.

20. The process of claim 11, further including isotropically ion etching said top surface trench to undercut the top surface of said trench to produce released cantilevered structures connected to said substrate.

21. The process of claim 20, wherein producing said first and second patterns includes defining aligned trenches surrounding a large are a platform to be formed in a cavity in said substrate.

22. The process of claim 21, wherein producing said first and second patterns includes defining said cantilevered support structures, to extend between said substrate and said platform.

23. A process for fabricating a large area, solid microelectromechanical platform supported by released, integral, flexible supports, comprising:

etching the top side of a wafer to form top trenches defining the platform and supports connected to the platform;

etching the bottom side of the wafer to form bottom trenches aligned with the top trenches;

further etching from the top side of the wafer to connect the trenches defining the platform to free the platform; and laterally underetching the supports to release them, thereby enabling the platform to move with respect to the wafer.

24. The process of claim 23, wherein the step of includes isotropic ion etching.

25. The process of claim 23, wherein etching the top side and the bottom side of the wafer includes etching around the defined platform for producing a platform having a thickness substantially equal to the thickness of the wafer.

26. The process of claim 23, wherein etching the bottom side of the wafer includes widening the bottom surface trench to etch a portion of the bottom surface of the defined platform to produce a thinned platform.

27. The process of claim 23, wherein etching the bottom trenches includes timing the etch to ensure that the platform is not freed during the bottom etching.

28. The process of claim 23, wherein further etching from the top surface includes performing a trench etch to deepen the first-formed trenches.

29. The process of claim 28, wherein laterally underetching includes performing an isotropic release etch in the trenches to create cantilevered supports extending between the platform and the wafer.

* * * * *

UNITED STATES PATENT AND TRADEMARK OFFICE
CERTIFICATE OF CORRECTION

PATENT NO. : 6,756,247 B1
DATED : June 29, 2004
INVENTOR(S) : Timothy J. Davis et al.

It is certified that error appears in the above-identified patent and that said Letters Patent is hereby corrected as shown below:

Column 11,
Line 50, replace "though" with -- through --.

Column 13,
Line 42, replace "are a" with -- area --.

Column 14,
Line 21, replace "the step of includes" with -- the step of laterally underetching includes --.

Signed and Sealed this

Fifth Day of April, 2005

JON W. DUDAS
*Director of the United States Patent and Trademark Office*